United States Patent
Lim et al.

(10) Patent No.: US 10,515,912 B2
(45) Date of Patent: Dec. 24, 2019

(54) INTEGRATED CIRCUIT PACKAGES

(71) Applicant: Intel Corporation, Santa Clara, CA (US)

(72) Inventors: Min Suet Lim, Penang (MY); Jiun Hann Sir, Penang (MY); Eng Huat Eh Goh, Penang (MY); Mooi Ling Chang, Bayan Baru (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/713,660

(22) Filed: Sep. 24, 2017

(65) Prior Publication Data

US 2019/0096833 A1 Mar. 28, 2019

(51) Int. Cl.
*H01L 23/00* (2006.01)
*H01L 21/56* (2006.01)
(Continued)

(52) U.S. Cl.
CPC .............. *H01L 24/05* (2013.01); *H01L 21/56* (2013.01); *H01L 21/76802* (2013.01); *H01L 21/76877* (2013.01); *H01L 23/3114* (2013.01); *H01L 23/481* (2013.01); *H01L 23/49822* (2013.01); *H01L 23/49838* (2013.01); *H01L 24/16* (2013.01); *H01L 24/81* (2013.01); *H01L 2224/0231* (2013.01); *H01L 2224/0239* (2013.01); *H01L 2224/02379* (2013.01); *H01L 2224/12105* (2013.01); *H01L 2224/13023* (2013.01); *H01L 2224/13024* (2013.01); *H01L 2224/13025* (2013.01);
(Continued)

(58) Field of Classification Search
CPC ............ H01L 23/481; H01L 23/49822; H01L 23/49838; H01L 24/16; H01L 24/81; H01L 2224/0231; H01L 2224/02379; H01L 2224/0239; H01L 2224/12105; H01L 2224/13023; H01L 2224/13024; H01L 2224/13025; H01L 2224/16227; H01L 2224/8188; H01L 2924/13091; H01L 2924/14
See application file for complete search history.

(56) References Cited

U.S. PATENT DOCUMENTS 5,808,874 A 9/1998 Smith
7,208,410 B2 4/2007 Larson
(Continued)

*Primary Examiner* — Hrayr A Sayadian
(74) *Attorney, Agent, or Firm* — Patent Capital Group

(57) ABSTRACT

Substrateless integrated circuit (IC) packages having a die with direct diagonal connections, as well as related structures, devices, and methods, are disclosed herein. For example, in some embodiments, an IC package may include: a die having a face with a plurality of contacts thereon, a dielectric layer in contact with the face, and a conductive pathway extending diagonally through the dielectric layer and coupling to an individual contact of the plurality of contacts on the die. In some embodiments, a conductive pathway may fan out to translate the contacts from a more dense layout to a less dense layout. In some embodiments, a conductive pathway may fan in to translate the contacts from a less dense layout to a more dense layout. In some embodiments, the dielectric layer and the conductive pathway may extend beyond the footprint of the die on one or more edges.

25 Claims, 10 Drawing Sheets

(51) Int. Cl.
*H01L 21/768* (2006.01)
*H01L 23/498* (2006.01)
*H01L 23/31* (2006.01)
*H01L 23/48* (2006.01)

(52) U.S. Cl.
CPC ............ *H01L 2224/16227* (2013.01); *H01L 2224/81801* (2013.01); *H01L 2924/13091* (2013.01); *H01L 2924/14* (2013.01)

(56) References Cited

U.S. PATENT DOCUMENTS

| | | | |
|---|---|---|---|
| 7,820,483 B2 | 10/2010 | Belanger et al. | |
| 8,835,228 B2 * | 9/2014 | Mohammed | H01L 24/18 |
| | | | 438/127 |
| 9,320,144 B2 | 4/2016 | Rathburn | |
| 2011/0056740 A1 * | 3/2011 | Takano | H01L 21/486 |
| | | | 174/262 |
| 2016/0358865 A1 | 12/2016 | Shih et al. | |

* cited by examiner

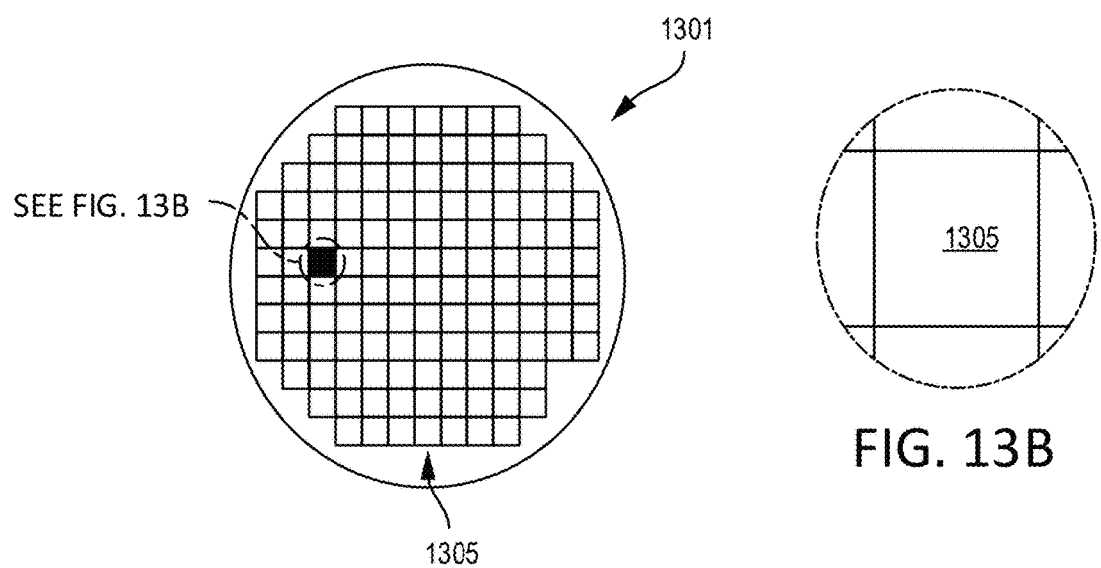
FIG. 13A
FIG. 13B
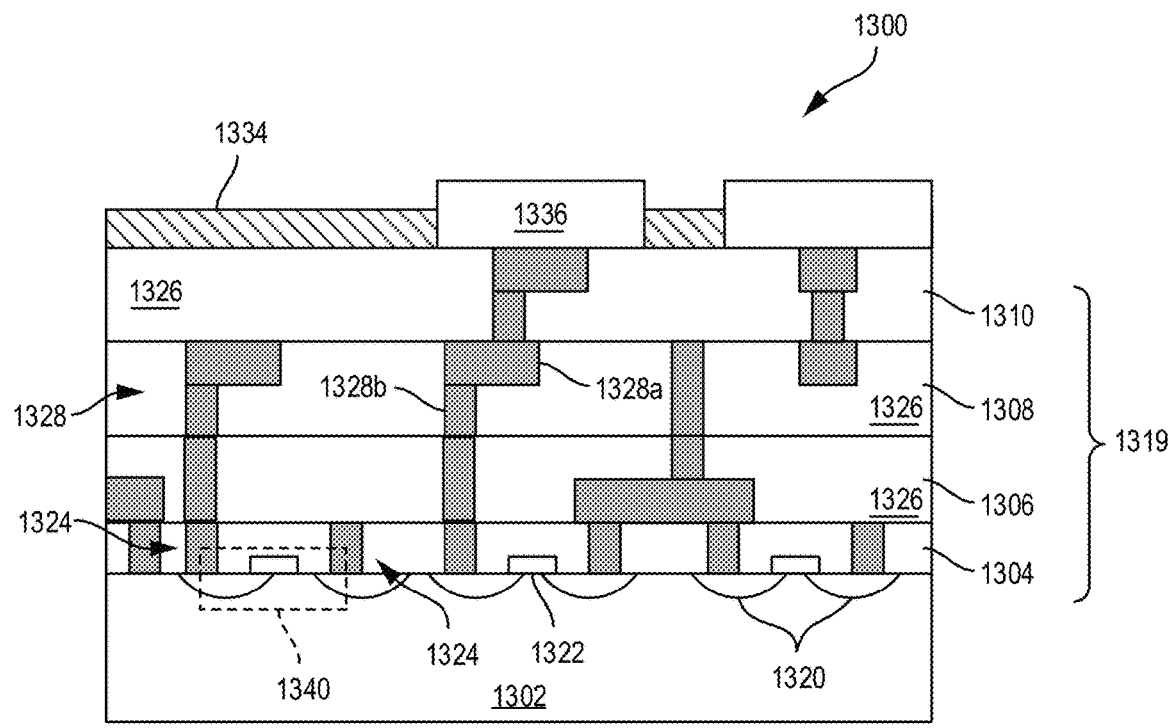
FIG. 13C

INTEGRATED CIRCUIT PACKAGES

BACKGROUND

Semiconductor dies are routinely connected to larger circuit boards such as motherboards and other types of printed circuit boards (PCBs) via a package substrate. A package substrate typically has two sets of connection points, a first set for connection to the die or multiple dies and a second less densely-packed set for connection to the circuit board.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 13A and 13B are top views of a wafer and dies that may be used with any of the embodiments of the packages disclosed herein.

FIG. 13C is a cross-sectional side view of an IC device that may be included in a die of an IC package having any of the embodiments of the packages disclosed herein.

DETAILED DESCRIPTION

Figure 1A:
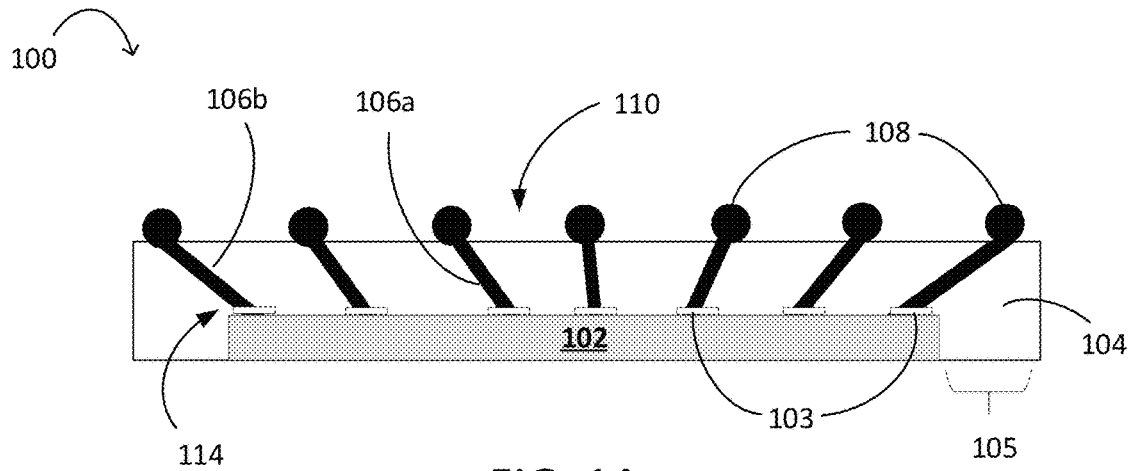
FIG. 1A is a cross-sectional side view of an integrated circuit assembly (IC) including a die having direct fan out connections, in accordance with various embodiments.

Substrateless integrated circuit (IC) packages having a die with direct diagonal connections, as well as related structures, devices, and methods, are disclosed herein. For example, in some embodiments, an IC package may include: a die having a face with a plurality of contacts thereon, a dielectric layer covering the plurality of contacts, and a conductive pathway extending diagonally from the top surface of the dielectric layer through the dielectric layer and connecting to an individual contact of the plurality of contacts on the die. In some embodiments, a conductive pathway may angle outwards or "fan out" (e.g., angle outwardly towards an outer edge of the die or outwardly from a center area, center point, or a center line of the die) to translate the contacts from a more dense layout to a less dense layout. In some embodiments, a conductive pathway may angle inwards or "fan in" (i.e., angle inwardly from an outer edge of the die or inwardly towards a center area, point, or line of the die) to translate the contacts from a less dense layout to a more dense layout. In some embodiments, the dielectric layer may encapsulate the die and may extend beyond the footprint of the die on one or more edges. In some embodiments, the conductive pathway at the top surface of the dielectric layer may extend beyond the footprint of the die.

Conventional integrated circuit devices have been constrained by the use of a package substrate to electrically couple a die or other device to a circuit board. A package substrate generally consists of an alternating sequence of a plurality of organic insulation or dielectric layers and a plurality of patterned electrically conductive layers forming traces between the insulation layers, and conductive vias, which extend through the insulation layers to electrically interconnect the conductive layers. The thickness of a package substrate, which depends on the required number of conductive layers, contributes to the overall thickness of the integrated circuit. Reducing the z-height of a package substrate typically requires a higher input and output (IO) routing density and increased manufacturing precision.

Various ones of the embodiments disclosed herein provide a substrateless IC structure including a die having conductive pathways (e.g., direct fan out or fan in connections) that extend diagonally through a dielectric layer from contacts on the die to contacts on a circuit board. In some embodiments, the diagonal conductive pathways may reduce the overall z-height of a package as compared to a conventional package substrate. In particular, some of the embodiments disclosed herein provide conductive pathways that extend diagonally through a dielectric layer and electrically couple a die and a circuit board. In some embodiments, the integrated circuit package having direct diagonal connections may include solder, such as a solder bump or a solder ball, disposed on the top surface of the dielectric layer and connected to the conductive pathway. In some embodiments, the IC package further includes a circuit board, where the die is electrically coupled to the circuit board via the conductive pathway. In some embodiments, the IC package may include a second die having direct diagonal connections in a package-on-package arrangement such that the second die is disposed on and electrically coupled to the first die. Further, the dielectric layer with the direct diagonal connections may provide a structure for supporting the conductive pathways and for minimizing warpage of the package. The dielectric layer material may be selected to minimize the coefficient of thermal expansion mismatch to the die material, which is, typically, silicon, and may be selected to optimize attachment to a circuit board.

Also disclosed herein are methods for manufacturing substrateless IC packages having a die with direct diagonal connections. For example, in some embodiments, during the silicon process of die manufacturing, a dielectric layer may be formed on the face of the die having a plurality of contacts, where the dielectric layer covers the contacts and extends beyond the footprint of the die on one or more edges. After the dielectric layer is formed, fan out tunnels may be formed and filled with conductive material to form diagonal conductive pathways extending outwardly from the contacts on the die to the top surface of the dielectric material. In some embodiments, during the silicon process of die manufacturing, a dielectric layer may be formed on the face of the die having a plurality of contacts, where the dielectric layer covers the contacts within the footprint of the die. After the dielectric layer is formed, fan in tunnels may be formed and filled with conductive material to form diagonal conductive pathways extending inwardly from the contacts on the die to the top surface of the dielectric material. Various embodiments disclosed herein provide for coupling a die having direct diagonal connections to a circuit board or other electronic component using methods such as thermo-compression bonding (TCB), mass reflow, surface activated bonding, conductive adhesive bonding, or surface mount technology (SMT).

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Common elements in different figures may be identified with a common label.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

FIG. 1A is a cross-sectional side view of an integrated circuit structure (IC) including a die having direct fan out connections, in accordance with various embodiments. The structure 100 may include a die 102 having a face 114 with a plurality of contacts 103, a dielectric layer 104 encapsulating die 102 and covering the plurality of contacts 103, where the dielectric layer extends beyond 105 the footprint of die 102, and one or more conductive pathways 106 extending diagonally and outwardly through dielectric layer 104 from contacts 103, such as contact pads or solder balls (not shown), on die 102. As used herein, the term "footprint" or "footprint area" of the die refers to the area (i.e., the product of the width and the length) of the die and, when the dielectric layer extends beyond the footprint of the die, the area of the dielectric layer is larger than the area of the die. The conductive pathways at the top surface 110 of the dielectric layer may include other conductive elements, for example, solder balls 108, and may be positioned to match contact pads of an electronic component (not shown). In some embodiments, structure 100 may include an electronic component (not shown), such as a circuit board, an interposer, or another die, for electrically coupling die 102 via conductive pathways 106a, 106b. In this manner, signals and/or power may be routed from the contacts on the face 114 of die 102 to the electronic component via conductive pathways 106a, 106b. In some embodiments, IC structure 100 may be positioned as shown in FIG. 1A to electrically couple to a bottom surface of an electronic component. In some embodiments, IC structure 100 may be flipped to electrically couple to a top surface of an electronic component.

Dielectric layer 104 and conductive pathways 106a, 106b may expand the connection area for contacts 103 and enable the remapping of contacts 103 from a more-densely packed arrangement to a less-densely packed arrangement. As shown in FIG. 1A, contacts 103 are configured to be closer together and may be smaller in size as compared to the expanded configuration on the top surface 110 of dielectric layer 104, which is depicted by solder balls 108, where the contacts 108 are arranged to be further apart and may be larger in size. The expanded configuration may depend on the size and shape of a die, the number and size of contacts on the die, the available area on an electronic component for attaching the die, and the size and thickness of the dielectric layer, among others.

Figure 1B:
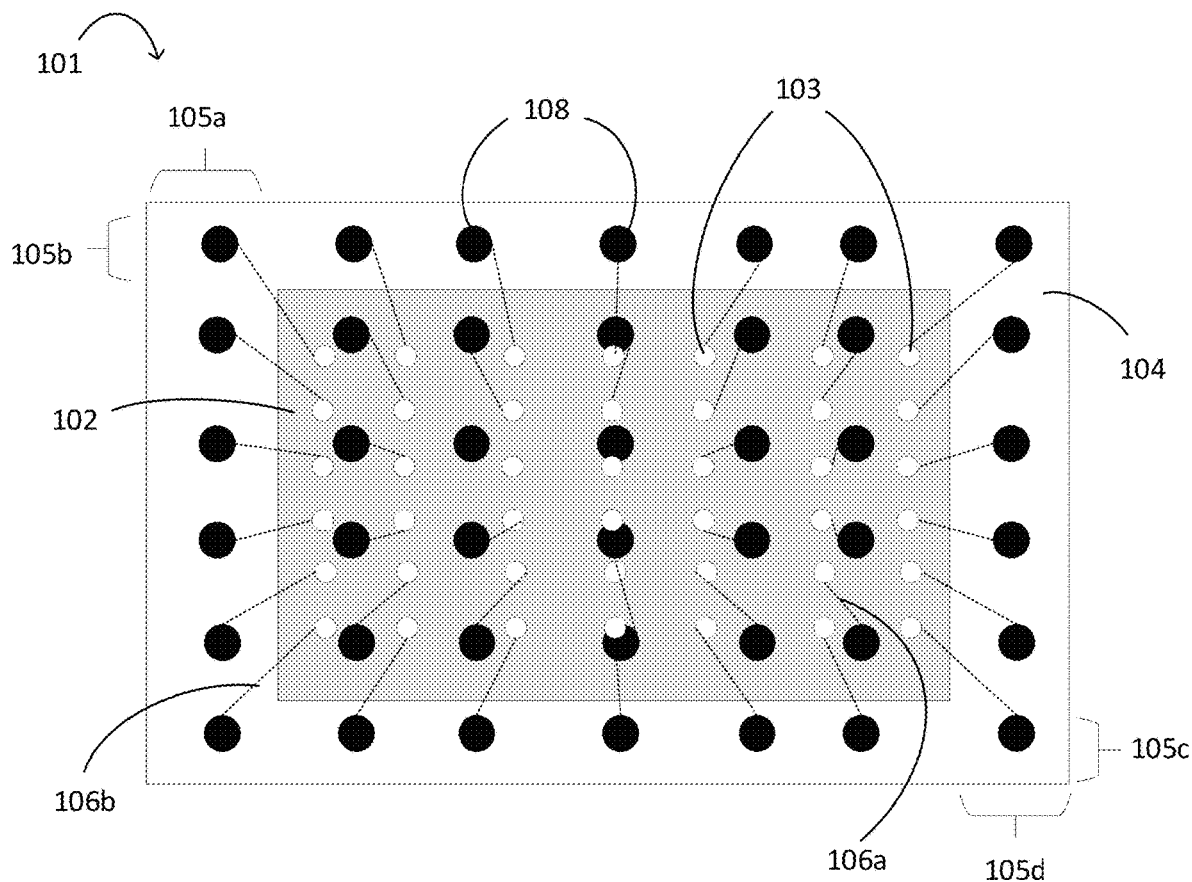
FIG. 1B is a top view of the IC assembly of FIG. 1A, in accordance with various embodiments.

FIG. 1B is a top view of the IC assembly of FIG. 1A, in accordance with various embodiments. The structure 101 viewed from top surface 110 may include die 102 having a face with a plurality of contacts 103 thereon, a dielectric layer 104 that may encapsulate die 102, that may cover contacts 103 and that may extend beyond 105a, 105b the footprint of die 102, and a plurality of conductive pathways 106 extending diagonally from contacts 103 through dielectric layer 104. Structure 101 may include solder 108 that electrically couple to conductive pathways 106 on the surface of dielectric layer 104. In some embodiments, the conductive pathways 106a may be within the footprint of die 102. In some embodiments, the conductive pathways 106b may extend beyond the footprint of die 102. The plurality of contacts 103 may be any suitable exposed contact, including, for example, contact pads, under bump metallization (UBM), and solder balls.

Dielectric layer 104 may be formed with any suitable process, such as lamination or slit coating and curing, and with any suitable material, such as polyimide or epoxy with silica. Dielectric layer 104 may be any suitable size and shape, and may be formed to be in contact with the plurality of contacts 103 and may extend beyond the footprint of die 102. Although FIG. 1B shows dielectric layer 104 extending beyond the footprint of die 102 on all four sides or edges 105a, 105b, 105c, 105d, it may be understood that the dielectric layer may extend beyond the footprint of the die on as many sides as necessary to provide fan out connections to match contacts to another electronic component, and, as such, the dielectric layer may extend beyond the footprint of the die on one edge, or on more than one edge. Further, although die 102 and dielectric layer 104 are shown as rectangular in shape, die 102 and dielectric layer 104 may be any suitable shape for expanding die contacts into a larger area and remapping die contacts from a more-densely packed arrangement to a less-densely packed arrangement. In some embodiments, dielectric layer 104 may be the same shape as die 102. In some embodiments, dielectric layer 104 may be a different shape as compared to die 102, for example, die 102 may be square and dielectric layer 104 may be rectangular.

The thickness of dielectric layer 104 may take any suitable value. The thickness of dielectric layer 104 may depend on the amount of area and volume required for expanding the contact area to the desired layout and housing the conductive pathways. In some embodiments, the thickness of dielectric layer 104 (at the thickest point) is no greater than twice the thickness of the die. In some embodiments, a maximum thickness of dielectric layer 104 may range from 0.5 millimeters to 1.5 millimeters. In some embodiments, a minimum thickness of dielectric layer 104 may range from 0.03 millimeters to 0.1 millimeters. In some embodiments, the thickness of dielectric layer 104 is minimized to reduce Z-height of the IC package. Dielectric layer 104 may include one or more layers of material. In some embodiments, dielectric layer 104 may include multiple layers where each layer is made from the same or different materials. Dielectric layer may be planarized or thinned by a grinding operation, including mechanical grinding/polishing, mechanical cutting, and/or chemical mechanical polishing (e.g., CMP).

Dielectric layer 104 may be formed of any suitable material, such as a polymer compound (e.g., polyimide), a poly-resin mold compound, an elastomer mold compound, or any other suitable material. Other examples of compounds that may be included in dielectric layer 104 may include plastic materials, thermosetting polymers, silicon composites, glass, epoxy resins, or fiberglass epoxy resins. Dielectric layer 104 may also include some filler material. For example, dielectric layer 104 may include an epoxy resin with tiny grains (e.g., on the order of a micrometer) of fused silica or amorphous silicon dioxide. In some embodiments, dielectric layer 104 may be a flexible material. In some embodiments, dielectric layer 104 may be a rigid or semi-rigid material to provide additional structure and mechanical support to conductive pathways 106 and die 102. In some embodiments, dielectric material may be transparent or semi-transparent so that die contacts 103 are visible through the dielectric layer. In some embodiments, dielectric layer 104 may be a heat conductive (but electrically insulative) material that may allow heat to travel through the material to the top surface or interconnect surface to enable attachment to an electronic component by, for example, thermal compression bonding. In some embodiments, dielectric layer material may be selected to prevent warpage as well.

Conductive pathways 106 may be linear structures that extend at an angle, other than perpendicularly, (i.e., extending diagonally or at a slant) relative to the face of the die from an individual contact 103 to provide an electrical connection to die 102. Conductive pathways 106 may be formed of one or more conductive materials, such as a metal (e.g., copper, solder, tin, nickel, aluminum, titanium, stainless steel, beryllium, molybdenum, tungsten, silicon carbide, and tungsten carbide) that is flowable for forming the pathways and, then, solidifies. Conductive pathways 106 may include a seed layer sputtered on the plurality of contacts to form a die pad 102 finishing layer and to improve the adhesion between the pathway and solder ball. The seed layer material may include, for example, copper, nickel, palladium, titanium, or vanadium, or a combination of these and other materials. Conductive pathways 106 may be any suitable length and thickness, and may have any suitable cross-sectional shape, such as round, square, or oval. Conductive pathways 106 may vary in size and shape such that a first conductive pathway, for example, may be longer and/or thicker than a second conductive pathway. For example, in some embodiments, the length of the conductive pathway may range from 0.5 millimeters to 500 millimeters. In some embodiments, the length of the conductive pathway may range from 0.5 millimeters to 150 millimeters. In some embodiments, the thickness of the conductive pathway may range from 50 microns to 300 microns. In some embodiments, the thickness of the conductive pathway may be equal to or less than the thickness of the contact pad on the die. In some embodiments, the thickness of the conductive pathway may range from 77 microns to 200 microns. Although conductive pathways 106 are illustrated in FIG. 1A as having substantially parallel sidewalls, conductive pathways 106 may have any profile (e.g., as dictated by the manufacturing operations used to form the conductive pathways 106). For example, in some embodiments, the conductive pathways may be tapered towards the die 102 or the top surface 110 of the dielectric layer 104. In some embodiments, the width (e.g., the diameter) may differ along the length of the conductive pathway, where one portion may be wider (e.g., have a larger diameter) than another portion. Although the cross-sections of conductive pathways 106 are illustrated in FIG. 1B as substantially circular, the cross-sections of conductive pathways 106 may have any profile (e.g., as dictated by the manufacturing operations used to form the conductive pathways 106), such as square, oval, rectangular, triangular, or octagonal.

Figure 2A:
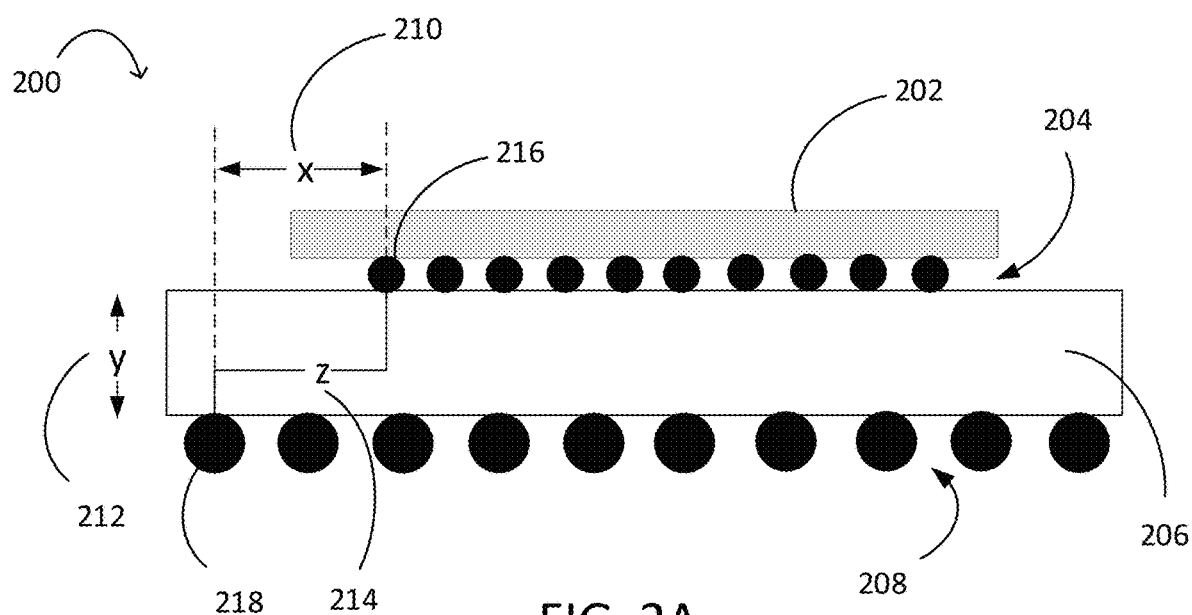
FIG. 2A is a cross-sectional side view of an exemplary IC assembly having a die connected to a circuit board via a package substrate, in accordance with various embodiments.

FIG. 2A is a cross-sectional side view of an exemplary IC assembly having a die connected to a circuit board via a package substrate, in accordance with various embodiments. As illustrated by structure 200, conventional integrated circuit devices use a package substrate 206 to electrically couple a die 202 or other device to a circuit board (not shown). First level interconnects (FLI) 204 electrically connect die 202 to package substrate 206. Second level interconnects (SLI) 208 electrically connect package substrate 206 to a circuit board (not shown). Package substrate 206 routes connections from the more-densely packed FLI 204 to the less densely packed SLI 208. As shown in FIG. 2A, the distance between individual FLI 216 and corresponding SLI 218 is equal to distance x 210 plus thickness y 212, which is equal to distance z 214. A package substrate generally consists of a plurality of alternating dielectric layers and patterned conductive layers (e.g., traces) where conductive vias, which extend vertically through the insulation layers, electrically interconnect the conductive layers. In this manner, electrical connections are formed from interconnecting vertical (vias) and horizontal (traces) portions, as depicted by the distance z 214.

Figure 2B:
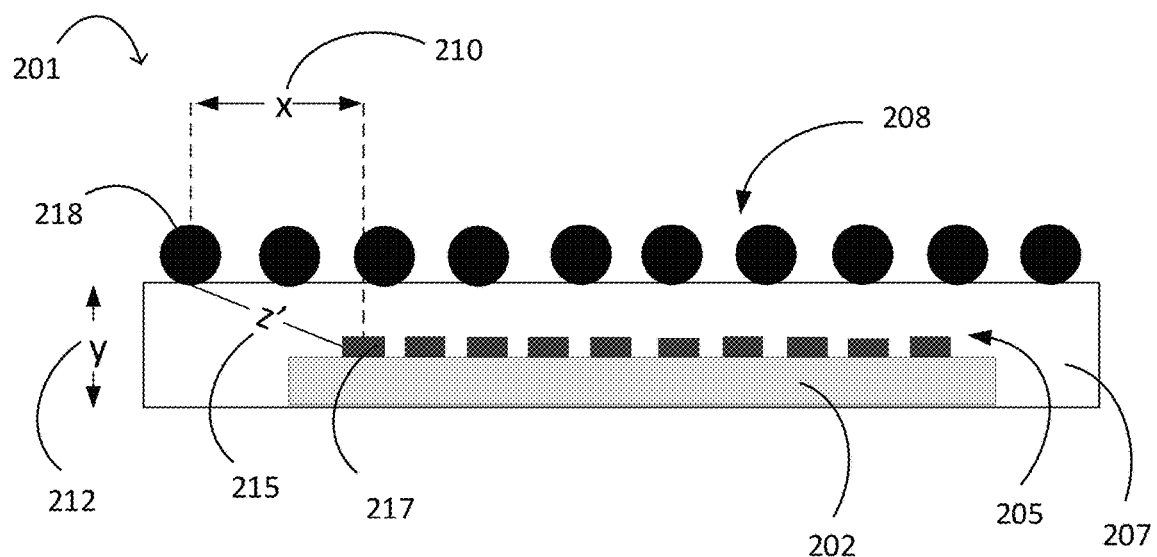
FIG. 2B is a cross-sectional side view of an exemplary IC assembly having a die connected to a circuit board via direct fan out interconnects, in accordance with various embodiments.

FIG. 2B is a cross-sectional side view of an exemplary IC assembly having a die connected to a circuit board via direct fan out interconnects, in accordance with various embodiments. Structure 201 may include die 202 having a face with a plurality of contacts 205 thereon, dielectric layer 207, which encapsulates die 202 and covers contacts 205 on the face of die 202. Dielectric layer 207 may extend beyond the footprint of die 202 and may have a thickness of y 212. SLI 208 may electrically couple die 202 to a circuit board (not shown). Die contact 217 corresponds to SLI 218. Structure 201 may include conductive pathway z' 215 to electrically couple contact 217 and corresponding SLI 218, which is a shorter distance as compared to the length and width distance of x 210 plus y 212. Further, conductive pathway 215 is a linear and contiguous path, which is likely to improve signal integrity by reducing signal transitions (e.g., from via to trace to via) and by providing a shorter and/or more direct routing path.

FIGS. 3-9 illustrate cross-sectional views of various stages in an example manufacture of an IC assembly including a die having direct fan out connections, in accordance with various embodiments. Although particular techniques are discussed below with reference to FIGS. 3-9, any suitable methods may be used to manufacture embodiments of a die having direct fan out connections. Additionally, although operations discussed below refer to using solder bumps to form electrical connections, any other suitable techniques for electrically coupling may be used including, but are not limited to, thermocompression bonding, thermosonic bonding, or conductive adhesive attachment.

Figure 3:
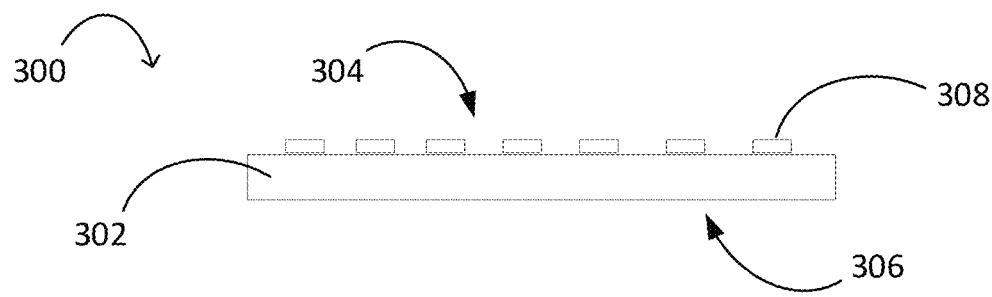
FIGS. 3-8 illustrate cross-sectional views of various stages in an example manufacture of an IC assembly including a die having direct fan out connections, in accordance with various embodiments.

FIG. 3 illustrates an assembly 300, which includes die 302 having a first surface or side 304 and an opposing second surface or side 306. First side 304 may include a plurality of contacts 308 thereon for electrically coupling die 302 to an electronic component (not shown). Die 302 may perform any suitable functionality, and may include processing devices, memory, communications devices, sensors, or any other computing components or circuitry. For example, die 302 may be DRAM, flash memory, modem, processor, or radio frequency components, among others. In some embodiments, multiple dies are stacked and electrically coupled one to the other.

Optionally, a temporary carrier or mold structure (not shown) may be used to provide stability to the package during manufacturing. The carrier may be of any suitable material, such as stainless steel, glass, silicon, fiber-glass reinforced epoxy, among others. Die 302 may be attached to the carrier using any suitable means that may allow for removal at the end of the process, for example, an adhesive. The adhesive should remain stable through processing, and release adhesion at the end of the process through exposure to high temperature, ultraviolet light, or mechanical peeling, among other techniques.

Figure 4:
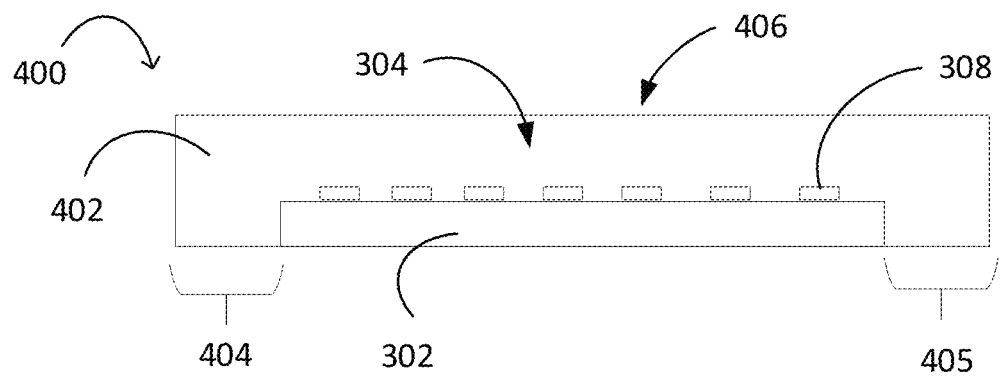

FIG. 4 illustrates an assembly 400 subsequent to forming a dielectric layer 402 on the first side of assembly 300. Dielectric layer 402 may encapsulate die 302 and may extend beyond the footprint of die 404, 405. As described above with reference to FIGS. 1A and 1B, dielectric layer 402 may extend beyond the footprint of die 302 on one edge or on more than one edge, and may extend different distances beyond the footprint such that distances 404 and 405 may be the same or may be different. Dielectric layer 402 may be in contact with contacts 308 and may vary in thickness depending on the desired contact arrangement on the top surface of the dielectric layer 406 and the space necessary for forming and housing direct fan out conductive pathways.

Figure 5:
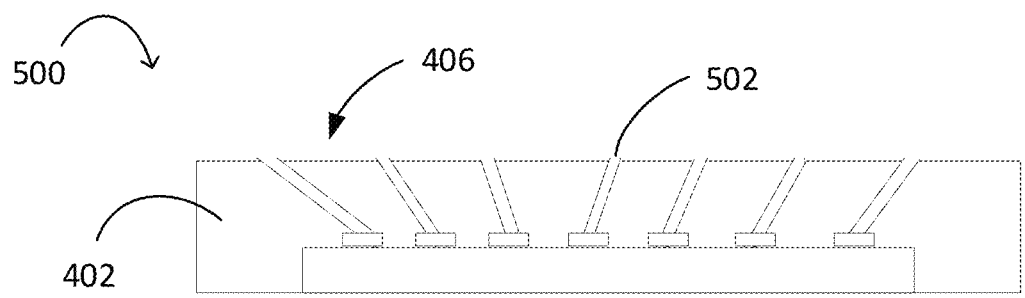

FIG. 5 illustrates an assembly 400 subsequent to forming tunnels 502 in assembly 400. Tunnels 502 may be formed through dielectric layer 402 using any suitable technique, such as high precision needle injection or high precision laser. High precision needle injection may be inserted through dielectric layer 402 to form a tunnel 502 from an individual contact 308 to the top surface of the dielectric layer 406. Dielectric material may be removed from tunnel 502 using any suitable process, for example, the high precision needle may include a vacuum for removing material as the needle is removed from the dielectric layer, and the high precision laser may further involve chemical or physical desmearing process. The tunnels may be planned and designed using three-dimensional design technology so that the contacts at the top surface of the dielectric layer 406 match the connection points for attaching to an electronic component and the dielectric layer dimensions fit the conductive pathways and top surface connection points. In some embodiments, dielectric material 402 may be transparent or semi-transparent such that contacts 308 are visible and provide a target for forming tunnels 502.

Figure 6:
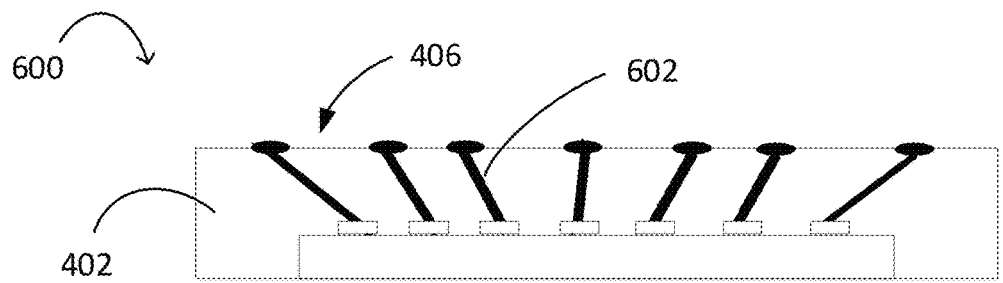

FIG. 6 illustrates an assembly 600 subsequent to filling tunnels of assembly 500 with conductive material 602. Conductive material 602 may be flowable and may be injected to fill tunnel 502. In some embodiments, a seed layer of conductive material may be sputtered on the plurality of contacts before depositing the dielectric layer or may be injected into tunnel 502 before filling the tunnels with conductive material to form conductive pathways. Seed layer material may include, for example, nickel, palladium, copper, and copper alloy. Conductive material may be any suitable material, including copper or solder, that is flowable for filling tunnels 502 and then solidifies. Conductive material 602 may completely fill the tunnels, may overfill the tunnels (as shown), or may underfill the tunnels. When conductive material fills or overfills the tunnels, the conductive material may form contacts on a top surface of the dielectric material. When conductive material underfills the tunnels, additional conductive material, such as solder as described with reference to FIG. 7, may be added to fill the tunnels and form contacts on a top surface of the dielectric layer. Conductive material may be selected based on desired material properties, for example, conductive pathway material may be selected to have a higher melting point as compared to solder ball material or other contact pad material, such that conductive pathways do not soften or melt when attached to an electronic component.

Assembly 600 may be manufactured as a single unit or may be a repeating unit that may undergo a singulation process in which each unit is separated from one another to create a single die having direct fan out connections.

Figure 7:
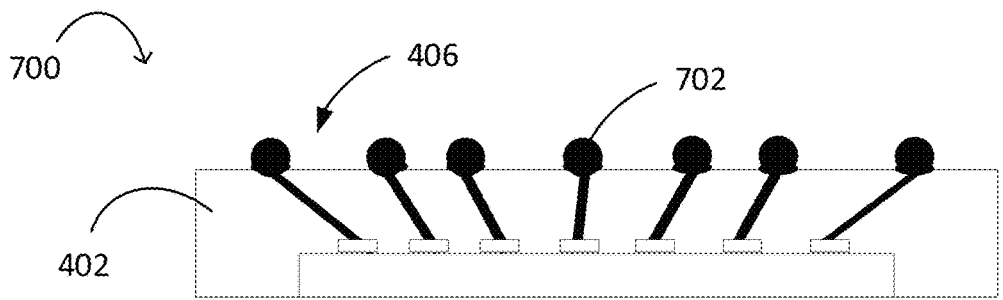

FIG. 7 illustrates an assembly 700 subsequent to placing solder 702 on assembly 600. The solder, such as solder bumps or solder balls, may be added using any suitable technique, such as standard substrate microball technology, solder paste printing, or solder electroplating, among others. Solder 702 may add material to fill any underfilled tunnels.

Figure 8:
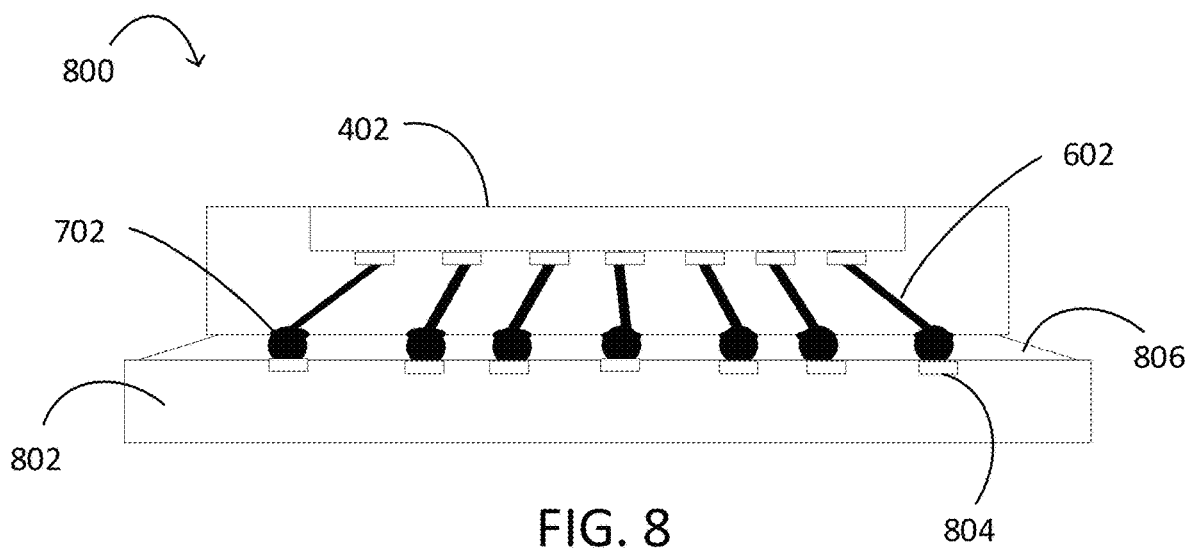

FIG. 8 illustrates an assembly 800 subsequent to mounting assembly 700 to top side of a circuit board 802 and reflowing solder 702. Assembly 700 may be flipped and then mounted to circuit board 802 using any suitable technique, such as standard mounting technology (SMT), thermal compression bonding (TCB), mass reflow, thermosonic bonding, or conductive adhesive attachment. Circuit board 802 may be any suitable industry-standard circuit board, such as a mother board. In some embodiments, the circuit board 802 may be a printed circuit board (PCB) including multiple metal layers separated from one another by layers of dielectric material and interconnected by electrically conductive vias. In other embodiments, the circuit board 802 may be a non-PCB substrate. In some embodiments, assembly 700 is not flipped and is mounted to a bottom surface of a circuit board rather than a top surface of a circuit board. Solder 702 on assembly 700 may be matched to contact pads 804 on circuit board 802, such that conductive pathways 602 may route signals from die 302 to circuit board 802.

Assembly 800 may include underfill 806, which may be a mold compound or any other suitable material to fill the gap between the die assembly 700 and the circuit board 802. Underfill 806 may be applied using any suitable technique, such as transfer mold, capillary underfill, or epoxy flux as part of the TCB process.

Although FIG. 8 illustrates assembly 700 mounted on a circuit board, assembly 700 may be mounted on any suitable electronic component or device, including, for example, another die or another substrate.

Figure 9:
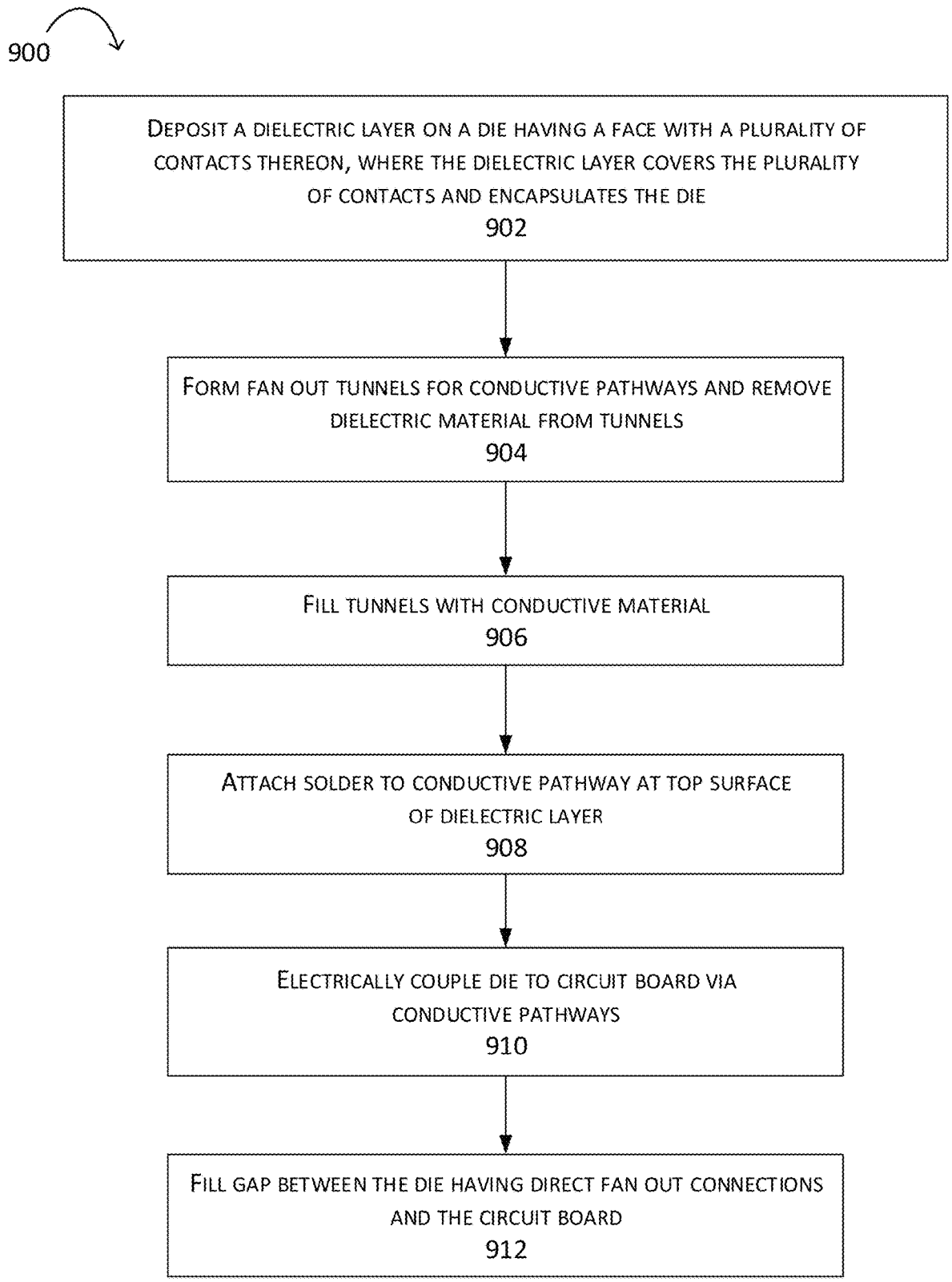
FIG. 9 is a flow diagram of an example method of manufacturing an IC assembly including a die having direct fan out connections, in accordance with various embodiments.

FIG. 9 is a flow diagram of a method 900 of manufacturing a die having direct fan out connections, in accordance with various embodiments. Although the operations discussed below with reference to FIG. 9 are discussed in a particular order and once each, these operations may be performed multiple times (e.g., in parallel or in series) or in a different order, as appropriate. Additionally, although the operations discussed below with reference to FIG. 9 are illustrated by reference to various ones of the embodiments disclosed herein, the method 900 may be used to manufacture any suitable IC assembly.

At 902, a dielectric layer may be provided on and around a die having a face with a plurality of contacts thereon. For example, the dielectric layer may be deposited to cover the plurality of contacts on the face of the die, encapsulate the die on one or more sides, and extend beyond the footprint of the die on one or more edges.

At 904, one or more fan out tunnels may be formed through the dielectric layer and any dielectric material in the tunnels may be removed using any suitable process. For example, the tunnels may be formed using high precision needle injection and the material may be removed using a vacuum process. In another example, the tunnels may be formed using a laser and the residual material may be removed using a desmear process. The tunnels may extend diagonally from an individual contact on the die to the top surface of the dielectric layer for scaling the plurality of contacts from a more-densely packed arrangement to a less-densely packed arrangement that matches connections to a circuit board or other electronic component. Dielectric material may be removed during tunnel formation or may be removed after tunnel formation.

At 906, the tunnels may be filled with conductive material. For example, the tunnels may be filled with a flowable conductive material, such as high temperature reflowed solder, that subsequently set or solidifies to form the conductive pathways.

At 908, a solder ball or other contact may be attached to the conductive pathway at the top surface of the dielectric layer.

At 910, the die may be electrically coupled to a circuit board via the conductive pathways by connecting the plurality of conductive contacts at the top surface of the dielectric layer to conductive contacts on the circuit board. For example, the die may be electrically connected to the circuit board by a standard SMT process or by TCB.

At 912, fill gap formed between the IC structure having a die with direct fan out connections and the circuit board with underfill material.

Figure 10A:
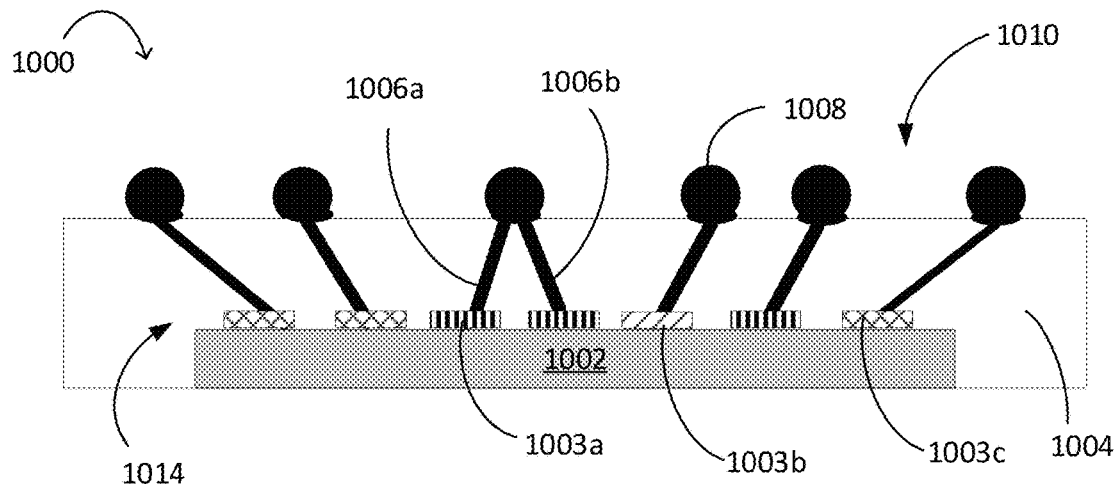
FIG. 10A is a cross-sectional side view of another example die having direct fan out connections, in accordance with various embodiments.

FIG. 10A is a cross-sectional side view of another example die having direct fan out connections, in accordance with various embodiments. The structure 1000 may include a die 1002 having a face 1014 with a plurality of contacts 1003 thereon, a dielectric layer 1004 encapsulating die 1002 and covering die and the plurality of contacts 1003 on the face 1014. Dielectric layer 1004 may extend beyond the footprint of die 1002, and may have one or more conductive pathways 1006 extending diagonally through dielectric layer 1004 from contacts 1003. As shown in FIG. 10A, one or more conductive pathways 1006a, 1006b may electrically couple to a single contact 1008 at the top surface 1010 of dielectric layer such that one or more contacts share the same power or ground connection.

Figure 10B:
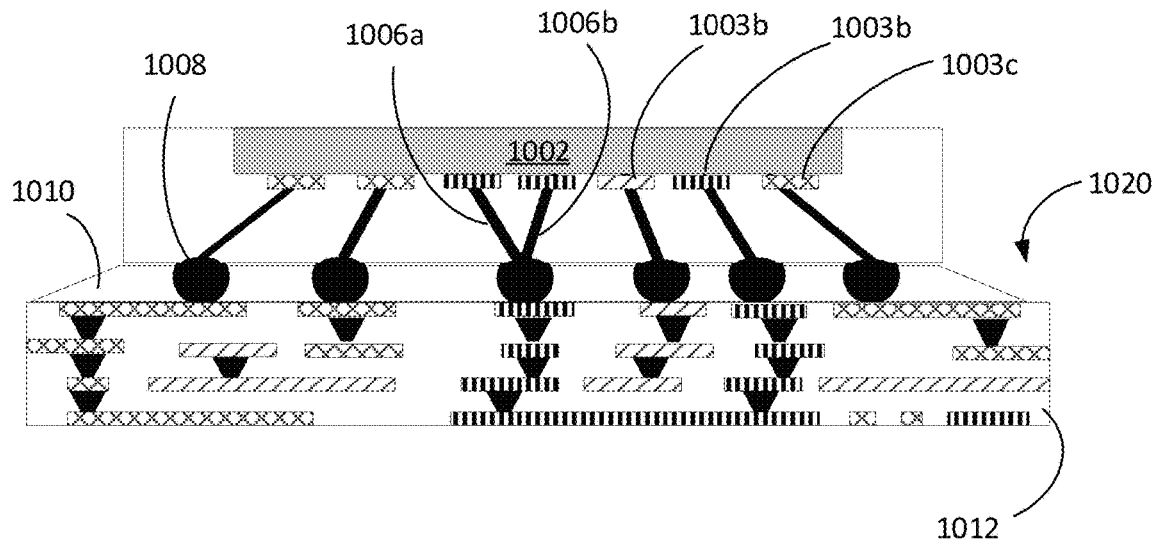
FIG. 10B is a cross-sectional side view of the IC assembly of FIG. 10A connected to a circuit board, in accordance with various embodiments.

FIG. 10B is a cross-sectional side view of the IC assembly of FIG. 10A connected to a circuit board, in accordance with various embodiments. The structure 1001 may include an electronic component or device, such as a circuit board 1012, for electrically connecting die 1002 via conductive pathways 1006. FIG. 10B illustrates assembly 1000 flipped and mounted to the top surface 1020 of circuit board 1012. The area between die 1002 and circuit board 1012 may be filled with underfill (not shown). The conductive pathways at the surface of the dielectric layer (i.e., interface of dielectric layer 1004 and circuit board 1012) may include other conductive elements, for example, solder balls 1008, and may be positioned to match contact pads of circuit board 1012. In this manner, signals and/or power may be routed from the face 1014 of die 1002 to circuit board 1012 via conductive pathways 1006. As shown in FIG. 10B, the circuit board 1012 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1012. FIG. 10B illustrates contacts 1003a as connecting to power, contacts 1003b connecting to ground, and contacts 1003c connecting to PCB breakout routing, where multiple contacts share the power plane via the conductive pathways 1006.

Figure 11:
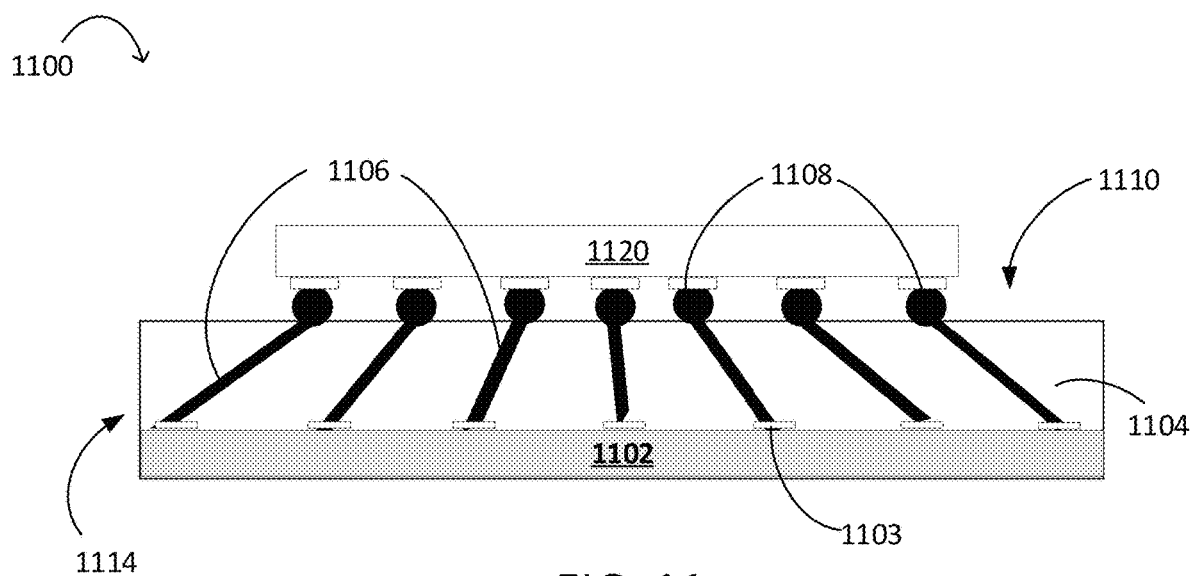
FIG. 11 is a cross-sectional side view of an example die having direct fan in connections, in accordance with various embodiments.

FIG. 11 is a cross-sectional side view of an integrated circuit structure including a die having direct fan in connections, in accordance with various embodiments. The structure 1100 may include a die 1102 having a face 1114 with a plurality of contacts 1103, a dielectric layer 1104 encapsulating die 1102 and covering the plurality of contacts 1103, where the dielectric layer may be within the footprint of die 1102, and one or more conductive pathways 1106 extending diagonally and inwardly through dielectric layer 1104 from contacts 1103, such as contact pads or solder balls (not shown), on die 1102. The conductive pathways at the top surface 1110 of the dielectric layer may include other conductive elements, for example, solder balls 1108, and may be positioned to match contact pads of an electronic component (not shown). In some embodiments, structure 1100 may include an electronic component 1120, such as another die, for electrically coupling die 1102 via conductive pathways 1106. In this manner, signals and/or power may be routed from the contacts on the face 1114 of die 1102 to the electronic component via conductive pathways 1106a, 1106b. In some embodiments, IC structure 1100 may be positioned as shown in FIG. 11 to electrically couple to a bottom surface of an electronic component. In some embodiments, IC structure 1100 may be flipped to electrically couple to a top surface of an electronic component.

Dielectric layer 1104 and conductive pathways 1106 may reduce the connection area for contacts 1103 and enable the remapping of contacts 1103 from a less-densely packed arrangement to a more-densely packed arrangement 1108. As shown in FIG. 11, contacts 1108 are configured to be closer together and may be smaller in size as compared to the expanded configuration on the face of the die, where the contacts 1103 are arranged to be further apart and may be larger in size. The reduced configuration may depend on the size and shape of an electronic component, the number and size of contacts, the available area on an electronic component for attaching the die, and the size and thickness of the dielectric layer, among others. Structure 1100, including all elements, such as dielectric layer 1104, conductive pathways 1106, and contacts 1103, 1108, may take any suitable ones of the forms discussed above with reference to FIGS. 1A and 1B.

Figure 12:
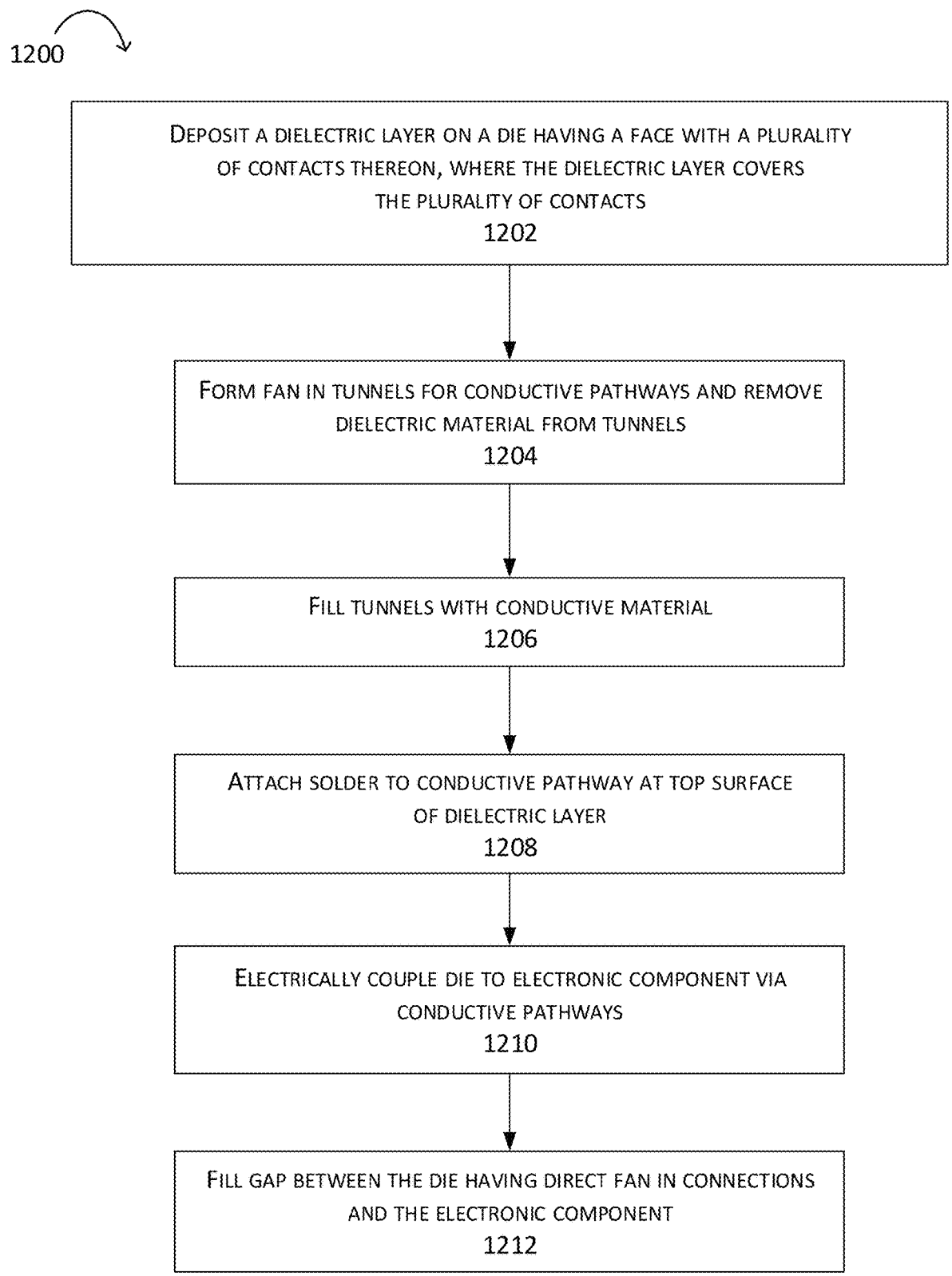
FIG. 12 is a flow diagram of an example method of manufacturing an IC assembly including a die having direct fan in connections, in accordance with various embodiments.

FIG. 12 is a flow diagram of a method 1200 of manufacturing a die having direct fan in connections, in accordance with various embodiments. Although the operations discussed below with reference to FIG. 12 are discussed in a particular order and once each, these operations may be performed multiple times (e.g., in parallel or in series) or in a different order, as appropriate. Additionally, although the operations discussed below with reference to FIG. 12 are illustrated by reference to various ones of the embodiments disclosed herein, the method 1200 may be used to manufacture any suitable IC assembly.

At 1202, a dielectric layer may be provided on a die having a face with a plurality of contacts thereon. For example, the dielectric layer may be deposited to cover the plurality of contacts on the face of the die, and optionally, may encapsulate the die on one or more sides.

At 1204, one or more fan in tunnels may be formed through the dielectric layer and any dielectric material in the tunnels may be removed. The tunnels may be formed in accordance with any of the techniques discussed above with reference to FIG. 9. The tunnels may extend diagonally from an individual contact on the die to the top surface of the dielectric layer for scaling the plurality of contacts from a less-densely packed arrangement to a more-densely packed arrangement that matches connections to another electronic component. Dielectric material may be removed during tunnel formation or may be removed after tunnel formation.

At 1206, the tunnels may be filled with conductive material. For example, the tunnels may be filled with a flowable conductive material, such as high temperature reflowed solder, that subsequently set or solidifies to form the conductive pathways.

At 1208, solder or other contact may be attached to the conductive pathway at the top surface of the dielectric layer.

At 1210, the die may be electrically coupled to an electronic component via the conductive pathways by connecting the plurality of conductive contacts at the top surface of the dielectric layer to conductive contacts on the electronic component. For example, the die may be electrically connected to the electronic component by a standard SMT process or by TCB.

At 1212, a gap formed between the IC structure having a die with direct fan in connections and the electronic component may be filled with underfill material.

Figure 14:
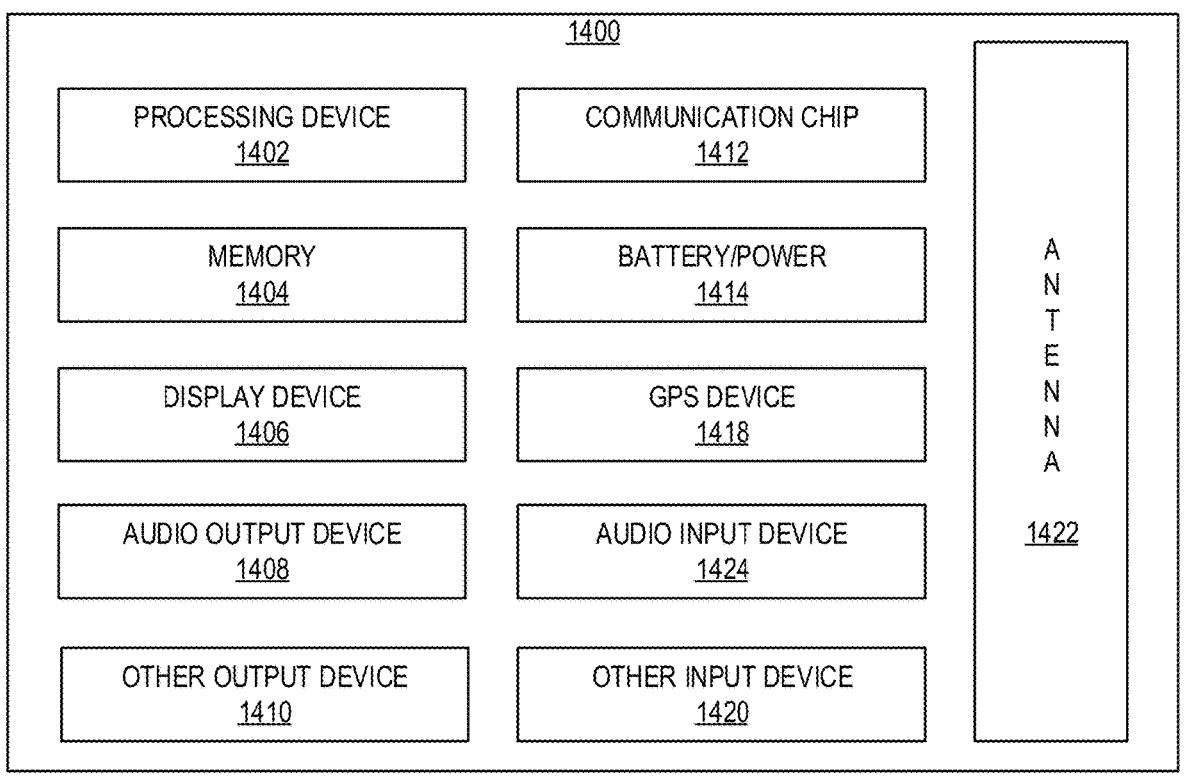
FIG. 14 is a block diagram of an example computing device that may include any of the embodiments of the packages disclosed herein.

The IC structures disclosed herein may be included in any suitable electronic device. FIGS. 13-14 illustrate various examples of apparatuses that may be included in, or that may include, one or more of any of the IC structures disclosed herein.

FIGS. 13A-B are top views of a wafer 1301 and dies 1305 that may be included in an IC assembly including a die having direct diagonal connections disclosed herein. The wafer 1301 may be composed of semiconductor material and may include one or more dies 1305 having IC elements formed on a surface of the wafer 1301. Each of the dies 1305 may be a repeating unit of a semiconductor product that includes any suitable IC. After the fabrication of the semiconductor product is complete, the wafer 1301 may undergo a singulation process in which each of the dies 1305 is separated from one another to provide discrete "chips" of the semiconductor product. The die 1305 may include one or more transistors (e.g., some of the transistors 1340 of FIG. 13C, discussed below) and/or supporting circuitry to route electrical signals to the transistors, as well as any other IC components. In some embodiments, the wafer 1301 or the die 1305 may include a memory device (e.g., a static random access memory (SRAM) device), a logic device (e.g., AND, OR, NAND, or NOR gate), or any other suitable circuit element. Multiple ones of these devices may be combined on a single die 1305. For example, a memory array formed by multiple memory devices may be formed on a same die 1305 as a processing device (e.g., the processing device 1202 of FIG. 12) or other logic that is configured to store information in the memory devices or execute instructions stored in the memory array. In some embodiments, the die 1305 may include circuitry that is to couple to and interact with circuitry provided by integral devices in the package substrate, after the die 1305 is coupled to the package substrate, as discussed above.

FIG. 13C is a cross-sectional side view of an IC device 1300 that may be included in a die that may be coupled to any of the package substrates disclosed herein. In particular, one or more of the IC devices 1300 may be included in one or more dies. The IC device 1300 may be formed on a substrate 1302 (e.g., the wafer 1301 of FIG. 13A) and may be included in a die (e.g., the die 1305 of FIG. 13B). The substrate 1302 may be a semiconductor substrate composed of semiconductor material systems including, for example, N-type or P-type materials systems. The substrate 1302 may include, for example, a crystalline substrate formed using a bulk silicon or a silicon-on-insulator substructure. In some embodiments, the substrate 1302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1302. Although a few examples of materials from which the substrate 1302 may be formed are described here, any material that may serve as a foundation for an IC device 1300 may be used. The substrate 1302 may be part of a singulated die (e.g., the dies 1305 of FIG. 13B) or a wafer (e.g., the wafer 1301 of FIG. 13A).

The IC device 1300 may include one or more device layers 704 disposed on the substrate 1302. The device layer 1304 may include features of one or more transistors 1340 (e.g., metal oxide semiconductor field-effect transistors (MOSFETs)) formed on the substrate 1302. The device layer 1304 may include, for example, one or more source and/or drain (S/D) regions 1320, a gate 1322 to control current flow in the transistors 1340 between the S/D regions 1320, and one or more S/D contacts 1324 to route electrical signals to/from the S/D regions 1320. The transistors 1340 may include additional features not depicted for the sake of clarity, such as device isolation regions, gate contacts, and the like. The transistors 1340 are not limited to the type and configuration depicted in FIG. 13C and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 1340 may include a gate 1322 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 1340 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 1340 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1320 may be formed within the substrate 1302 adjacent to the gate 1322 of each transistor 1340. The S/D regions 1320 may be formed using either an implantation/diffusion process or an etching/deposition process, for example. In the former process, dopants such as boron, aluminum, antimony, phosphorous, or arsenic may be ion-implanted into the substrate 1302 to form the S/D regions 1320. An annealing process that activates the dopants and causes them to diffuse farther into the substrate 1302 may follow the ion-implantation process. In the latter process, the substrate 1302 may first be etched to form recesses at the locations of the S/D regions 1320. An epitaxial deposition process may then be carried out to fill the recesses with material that is used to fabricate the S/D regions 1320. In some implementations, the S/D regions 1320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1320 may be formed using one or more alternate semiconductor materials such as germanium or a group III-V material or alloy. In further embodiments, one or more layers of metal and/or metal alloys may be used to form the S/D regions 1320.

Electrical signals, such as power and/or input/output (I/O) signals, may be routed to and/or from the transistors 1340 of the device layer 704 through one or more interconnect layers disposed on the device layer 1304 (illustrated in FIG. 13C as interconnect layers 1306-1310). For example, electrically conductive features of the device layer 1304 (e.g., the gate 1322 and the S/D contacts 1324) may be electrically coupled with the interconnect structures 1328 of the interconnect layers 1306-1310. The one or more interconnect layers 1306-1310 may form an interlayer dielectric (ILD) stack 1319 of the IC device 1300.

The interconnect structures 1328 may be arranged within the interconnect layers 1306-1310 to route electrical signals according to a wide variety of designs (in particular, the arrangement is not limited to the particular configuration of interconnect structures 1328 depicted in FIG. 13C). Although a particular number of interconnect layers 1306-1310 is depicted in FIG. 13C, embodiments of the present disclosure include IC devices having more or fewer interconnect layers than depicted.

In some embodiments, the interconnect structures 1328 may include trench structures 1328a (sometimes referred to as "lines") and/or via structures 1328b (sometimes referred to as "holes") filled with an electrically conductive material such as a metal. The trench structures 1328a may be arranged to route electrical signals in a direction of a plane that is substantially parallel with a surface of the substrate 1302 upon which the device layer 1304 is formed. For example, the trench structures 1328a may route electrical signals in a direction in and out of the page from the perspective of FIG. 13C. The via structures 1328b may be arranged to route electrical signals in a direction of a plane that is substantially perpendicular to the surface of the substrate 1302 upon which the device layer 1304 is formed. In some embodiments, the via structures 1328b may electrically couple trench structures 1328a of different interconnect layers 1306-1310 together.

The interconnect layers 1306-1310 may include a dielectric material 1326 disposed between the interconnect structures 1328, as shown in FIG. 13C. In some embodiments, the dielectric material 1326 disposed between the interconnect structures 1328 in different ones of the interconnect layers 1306-1310 may have different compositions; in other embodiments, the composition of the dielectric material 1326 between different interconnect layers 1306-1310 may be the same.

A first interconnect layer 1306 (referred to as Metal 1 or "M1") may be formed directly on the device layer 1304. In some embodiments, the first interconnect layer 1306 may include trench structures 1328a and/or via structures 1328b, as shown. The trench structures 1328a of the first interconnect layer 1306 may be coupled with contacts (e.g., the S/D contacts 1324) of the device layer 1304.

A second interconnect layer 1308 (referred to as Metal 2 or "M2") may be formed directly on the first interconnect layer 1306. In some embodiments, the second interconnect layer 1308 may include via structures 1328*b* to couple the trench structures 1328*a* of the second interconnect layer 1308 with the trench structures 1328*a* of the first interconnect layer 1306. Although the trench structures 1328*a* and the via structures 1328*b* are structurally delineated with a line within each interconnect layer (e.g., within the second interconnect layer 1308) for the sake of clarity, the trench structures 1328*a* and the via structures 1328*b* may be structurally and/or materially contiguous (e.g., simultaneously filled during a dual-damascene process) in some embodiments.

A third interconnect layer 1310 (referred to as Metal 3 or "M3") (and additional interconnect layers, as desired) may be formed in succession on the second interconnect layer 1308 according to similar techniques and configurations described in connection with the second interconnect layer 1308 or the first interconnect layer 1306.

The IC device 1300 may include a solder resist material 1334 (e.g., polyimide or similar material) and one or more bond pads 1336 formed on the interconnect layers 1306-1310. The bond pads 1336 may provide the contacts to couple to first level interconnects, for example. The bond pads 1336 may be electrically coupled with the interconnect structures 1328 and configured to route the electrical signals of the transistor(s) 1340 to other external devices. For example, solder bonds may be formed on the one or more bond pads 1336 to mechanically and/or electrically couple a chip including the IC device 1300 with another component (e.g., a circuit board). The IC device 1300 may have other alternative configurations to route the electrical signals from the interconnect layers 1306-1310 than depicted in other embodiments. For example, the bond pads 1336 may be replaced by or may further include other analogous features (e.g., posts) that route the electrical signals to external components.

FIG. 14 is a block diagram of an example computing device 1400 that may include one or more of the package substrates disclosed herein. For example, any suitable ones of the components of the computing device 1400 may include, or be included in, an IC assembly including a die having direct diagonal connections, in accordance with any of the embodiments disclosed herein. A number of components are illustrated in FIG. 14 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1424 or an audio output device 1408, but may include audio input or output device interface circuitry (e.g., connectors and supporting circuitry) to which an audio input device 1424 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random-access memory (STT-MRAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The computing device 1400 may include a global positioning system (GPS) device 1418 (or corresponding interface circuitry, as discussed above). The GPS device 1418 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

The following examples pertain to further embodiments. The various features of the different embodiments may be variously combined with some features included and others excluded to suit a variety of different applications.

Example 1 is an integrated circuit (IC) package, including: a die having a plurality of contacts on a face; a dielectric material on the face of the die, wherein the dielectric material is in contact with the plurality of contacts and has an area greater than an area of the die; and a conductive pathway extending through the dielectric material having a first end and a second end, wherein the first end is electrically coupled to an individual contact of the plurality of contacts, and wherein the second end is at a top surface of the dielectric material and is positioned beyond the area of the die.

Example 2 may include the subject matter of Example 1, and may further specify that the conductive pathway extends diagonally through the dielectric material.

Example 3 may include the subject matter of any of Examples 1-2, and may further specify that the dielectric material comprises one or more of a polymer compound, a poly-resin mold compound, an elastomer mold compound, and silicon.

Example 4 may include the subject matter of any of Examples 1-3, and may further specify that a maximum thickness of the dielectric material is less than or equal to 1.5 millimeters.

Example 5 may include the subject matter of any of Examples 1-4, and may further specify that the conductive pathway comprises one or more of copper, solder, tin, nickel, aluminum, titanium, stainless steel, beryllium, molybdenum, tungsten, silicon carbide, and tungsten carbide.

Example 6 may include the subject matter of any of Examples 1-5, and may further specify that a length of the conductive pathway is between 0.5 millimeters and 500 millimeters.

Example 7 may include the subject matter of any of Examples 1-6, and may further specify that a thickness of the conductive pathway is between 30 microns and 300 microns.

Example 8 may include the subject matter of any of Examples 1-7, and may further include a metal seed layer on the plurality of contacts.

Example 9 may include the subject matter of any of Examples 1-8, and may further include solder on the second end of the conductive pathway.

Example 10 may include the subject matter of any of Examples 1-9, and may further include: a second conductive pathway extending through the dielectric material having a third end and a fourth end, wherein the third end is electrically coupled to a second individual contact of the plurality of contacts, and wherein the fourth end is at the top surface of the dielectric material; and a third conductive pathway extending through the dielectric material having a fifth end and a sixth end, wherein the fifth end is electrically coupled to a third individual contact of the plurality of contacts, and wherein the sixth end is electrically coupled to the fourth end at the top surface of the dielectric material.

Example 11 may include the subject matter of any of Examples 1-10, and may further include: a circuit board, wherein the die is electrically coupled to the circuit board via the conductive pathway.

Example 12 is an integrated circuit (IC) structure, including: a die having a plurality of first contacts on a face; a dielectric layer in contact with the face of the die; and a first conductive pathway connecting to a first individual contact of the plurality of first contacts and extending diagonally relative to the face of the die through the dielectric layer.

Example 13 may include the subject matter of Example 12, and may further specify that the first conductive pathway extends to a top surface of the dielectric layer.

Example 14 may include the subject matter of any of Examples 12-13, and may further include: a second conductive pathway connecting to a second individual contact of the plurality of first contacts and extending diagonally through the dielectric layer to electrically couple with the first conductive pathway at the top surface of the dielectric layer.

Example 15 may include the subject matter of any of Examples 12-14, and may further specify that the dielectric layer comprises one or more of a polymer compound, a poly-resin mold compound, an elastomer mold compound, and silicon.

Example 16 may include the subject matter of any of Examples 12-15, and may further specify that the first conductive pathway comprises one or more of copper, solder, tin, nickel, aluminum, titanium, stainless steel, beryllium, molybdenum, tungsten, silicon carbide, and tungsten carbide.

Example 17 may include the subject matter of any of Examples 12-16, and may further specify that the first conductive pathway further includes a metal seed layer on the plurality of first contacts.

Example 18 may include the subject matter of any of Examples 12-17, and may further specify that the first conductive pathway further includes solder at the top surface of the dielectric layer.

Example 19 may include the subject matter of any of Examples 12-18, and may further specify that the dielectric layer has an area greater than an area of the die, and that the first conductive pathway extends beyond the area of the die.

Example 20 may include the subject matter of Example 13, and may further specify the dielectric layer has an area greater than an area of the die, and may further include: a plurality of second contacts at the top surface of the dielectric layer, wherein the plurality of second contacts are arranged to be less dense as compared to the plurality of first contacts.

Example 21 may include the subject matter of Example 13, and may further include: a plurality of second contacts at the top surface of the dielectric layer, wherein the plurality of second contacts are arranged to be more dense as compared to the plurality of first contacts.

Example 22 may include the subject matter of Example 19, and may further include: a circuit board, wherein the die is electrically coupled to the circuit board via the first conductive pathway.

Example 23 may include the subject matter of Example 21, and may further include: an electronic component, wherein the die is electrically coupled to the electronic component via the first conductive pathway.

Example 24 is a method of manufacturing an integrated circuit (IC) structure, including: forming a dielectric layer on a face of a die, wherein the face of the die includes a plurality of contacts; forming one or more tunnels through the dielectric layer extending diagonally, relative to the face of the die, from a top surface of the dielectric layer to an individual contact of the plurality of contacts; and filling the one or more tunnels with conductive material to form one or more conductive pathways.

Example 25 may include the subject matter of Example 24, and may further include: removing dielectric material from the one or more tunnels before filling with conductive material.

Example 26 may include the subject matter of Example 24, and may further include: attaching solder to the one or more conductive pathways at the top surface of the dielectric layer.

Example 27 may include the subject matter of Example 24, and may further include: electrically coupling the die to a circuit board via the one or more conductive pathways.

Example 28 may include the subject matter of Example 27, and may further specify that the die is electrically coupled to the circuit board by a surface mount technology process.

Example 29 may include the subject matter of Example 27, and may further include: depositing underfill material in a gap between the dielectric layer on the die and the circuit board.

Example 30 may include the subject matter of Example 24, and may further include: sputtering a seed layer on the plurality of contacts.

Example 31 may include the subject matter of Example 24, and may further specify that the one or more conductive pathways extend diagonally towards an outer edge of the die.

Example 32 may include the subject matter of Example 24, and may further specify the one or more conductive pathways extend diagonally towards a center point or a center line of the die.

Example 33 is a computing device, including: an integrated circuit (IC) assembly, including: a die having a plurality of contacts on a face; a dielectric material on the face of the die, wherein the dielectric material is in contact with the plurality of contacts and has an area greater than an area of the die; and a conductive pathway extending through the dielectric material having a first end and a second end, wherein the first end is electrically coupled to an individual contact of the plurality of contacts, and wherein the second end is at a top surface of the dielectric material and is positioned beyond the area of the die; and a circuit board, wherein the circuit board is electrically coupled to the die via the conductive pathway.

Example 34 may include the subject matter of Example 33, and may further specify that the conductive pathway extends diagonally through the dielectric material.

Example 35 may include the subject matter of any of Examples 33-34, and may further specify that the dielectric material comprises one or more of a polymer compound, a poly-resin mold compound, an elastomer mold compound, and silicon.

Example 36 may include the subject matter of any of Examples 33-35, and may further specify that a maximum thickness of the dielectric material is less than or equal to 1.5 millimeters.

Example 37 may include the subject matter of any of Examples 33-36, and may further specify that the conductive pathway comprises one or more of copper, solder, tin, nickel, aluminum, titanium, stainless steel, beryllium, molybdenum, tungsten, silicon carbide, and tungsten carbide.

Example 38 may include the subject matter of any of Examples 33-37, and may further specify that a length of the conductive pathway ranges from 0.5 millimeters to 500 millimeters.

Example 39 may include the subject matter of any of Examples 33-38, and may further specify that a thickness of the conductive pathway ranges from 30 microns to 300 microns.

Example 40 may include the subject matter of any of Examples 33-39, and may further include a metal seed layer on the plurality of contacts.

Example 41 may include the subject matter of any of Examples 33-40, and may further include solder on the second end of the conductive pathway.

Example 42 may include the subject matter of any of Examples 33-41, and may further include: a second conductive pathway extending through the dielectric material having a third end and a fourth end, wherein the third end is electrically coupled to a second individual contact of the plurality of contacts, and wherein the fourth end is at the top surface of the dielectric material; and a third conductive pathway extending through the dielectric material having a fifth end and a sixth end, wherein the fifth end is electrically coupled to a third individual contact of the plurality of contacts, and wherein the sixth end is electrically coupled to the fourth end at the top surface of the dielectric material.

The invention claimed is:

1. An integrated circuit (IC) package, comprising:
a die having a plurality of contacts on a face, wherein the die has a total footprint area defined by a product of an outer edge to outer edge width and an outer edge to outer edge length of the face of the die;
a dielectric material in direct contact with the face of the die, wherein the dielectric material is in contact with the plurality of contacts, wherein the dielectric material has a total footprint area defined by a product of an outer edge to outer edge width and an outer edge to outer edge length of the dielectric material, and wherein the total footprint area of the dielectric material is greater than the total footprint area of the die; and
a conductive pathway extending through the dielectric material having a first end and a second end, wherein the first end is electrically coupled to an individual contact of the plurality of contacts, and wherein the second end is at a top surface of the dielectric material and is positioned beyond the total footprint area of the die.

2. The IC package of claim 1, wherein the conductive pathway extends diagonally through the dielectric material.

3. The IC package of claim 1, wherein the dielectric material comprises one or more of a polymer compound, a poly-resin mold compound, an elastomer mold compound, and silicon.

4. The IC package of claim 1, wherein a maximum thickness of the dielectric material is less than or equal to 1.5 millimeters.

5. The IC package of claim 1, wherein the conductive pathway comprises one or more of copper, solder, tin, nickel, aluminum, titanium, stainless steel, beryllium, molybdenum, tungsten, silicon carbide, and tungsten carbide.

6. The IC package of claim 1, wherein a length of the conductive pathway is between 0.5 millimeters and 500 millimeters.

7. The IC package of claim 1, wherein a thickness of the conductive pathway is between 30 microns and 300 microns.

8. The IC package of claim 1, further comprising a metal seed layer on the plurality of contacts.

9. The IC package of claim 1, further comprising solder on the second end of the conductive pathway.

10. The IC package of claim 1, further comprising:
a second conductive pathway extending through the dielectric material having a third end and a fourth end, wherein the third end is electrically coupled to a second individual contact of the plurality of contacts, and wherein the fourth end is at the top surface of the dielectric material; and
a third conductive pathway extending through the dielectric material having a fifth end and a sixth end, wherein the fifth end is electrically coupled to a third individual contact of the plurality of contacts, and wherein the sixth end is electrically coupled to the fourth end at the top surface of the dielectric material.

11. The IC package of claim 1, further comprising:
a circuit board, wherein the die is electrically coupled to the circuit board via the conductive pathway.

12. An integrated circuit (IC) structure, comprising:
a die having a plurality of first contacts on a face, wherein the die has a total footprint area defined by a product of an outer edge to outer edge width and an outer edge to outer edge length of the face of the die;
a dielectric layer in direct contact with the face of the die, wherein the dielectric layer has a total footprint area defined by a product of an outer edge to outer edge width and an outer edge to outer edge length of the dielectric layer, and wherein the total footprint area of the dielectric layer is greater than the total footprint area of the die; and
a first conductive pathway connecting to a first individual contact of the plurality of first contacts and extending diagonally relative to the face of the die through the dielectric layer.

13. The IC structure of claim 12, wherein the first conductive pathway extends to a top surface of the dielectric layer.

14. The IC structure of claim 13, further comprising:
a second conductive pathway connecting to a second individual contact of the plurality of first contacts and extending diagonally through the dielectric layer to electrically couple with the first conductive pathway at the top surface of the dielectric layer.

15. The IC structure of claim 12, wherein the dielectric layer comprises one or more of a polymer compound, a poly-resin mold compound, an elastomer mold compound, and silicon.

16. The IC structure of claim 12, wherein the first conductive pathway comprises one or more of copper, solder, tin, nickel, aluminum, titanium, stainless steel, beryllium, molybdenum, tungsten, silicon carbide, and tungsten carbide.

17. The IC structure of claim 12, wherein the first conductive pathway extends beyond the total footprint area of the die.

18. The IC structure of claim 12, further comprising:
a plurality of second contacts at the top surface of the dielectric layer, wherein the plurality of second contacts are arranged to be less dense as compared to the plurality of first contacts.

19. The IC structure of claim 12, further comprising:
a plurality of second contacts at the top surface of the dielectric layer, wherein the plurality of second contacts are arranged to be more dense as compared to the plurality of first contacts.

20. A method of manufacturing an integrated circuit (IC) structure, comprising:
   forming a dielectric layer directly on a face of a die, wherein the face of the die includes a plurality of contacts, wherein the die has a total footprint area defined by a product of an outer edge to outer edge width and an outer edge to outer edge length of the face of the die, wherein the dielectric layer has a total footprint area defined by a product of an outer edge to outer edge width and an outer edge to outer edge length of the dielectric layer, and wherein the total footprint area of the dielectric layer is greater than the total footprint area of the die;
   forming one or more tunnels through the dielectric layer extending diagonally, relative to the face of the die, from a top surface of the dielectric layer to an individual contact of the plurality of contacts; and
   filling the one or more tunnels with conductive material to form one or more conductive pathways.

21. The method of claim 20, further comprising:
removing dielectric material from the one or more tunnels before filling with conductive material.

22. The method of claim 20, further comprising:
electrically coupling the die to a circuit board via the one or more conductive pathways.

23. A computing device, comprising:
an integrated circuit (IC) assembly, comprising:
   a die having a plurality of contacts on a face, wherein the die has a total footprint area defined by a product of an outer edge to outer edge width and an outer edge to outer edge length of the face of the die;
   a dielectric material in direct contact with the face of the die, wherein the dielectric material is in contact with the plurality of contacts, wherein the dielectric material has a total footprint area defined by a product of an outer edge to outer edge width and an outer edge to outer edge length of the dielectric material, and wherein the total footprint area of the dielectric material is greater than the total footprint area of the die; and
   a conductive pathway extending through the dielectric material having a first end and a second end, wherein the first end is electrically coupled to an individual contact of the plurality of contacts, and wherein the second end is at a top surface of the dielectric material and is positioned beyond the total footprint area of the die; and
   a circuit board, wherein the circuit board is electrically coupled to the die via the conductive pathway.

24. The computing device of claim 23, wherein the conductive pathway extends diagonally through the dielectric material.

25. The computing device of claim 23, further comprising:
   a second conductive pathway extending through the dielectric material having a third end and a fourth end, wherein the third end is electrically coupled to a second individual contact of the plurality of contacts, and wherein the fourth end is at the top surface of the dielectric material; and
   a third conductive pathway extending through the dielectric material having a fifth end and a sixth end, wherein the fifth end is electrically coupled to a third individual contact of the plurality of contacts, and wherein the sixth end is electrically coupled to the fourth end at the top surface of the dielectric material.

* * * * *